United States Patent
Aleksov et al.

(10) Patent No.: US 9,591,758 B2
(45) Date of Patent: Mar. 7, 2017

(54) FLEXIBLE ELECTRONIC SYSTEM WITH WIRE BONDS

(71) Applicant: Intel Corporation, Santa Clara, CA (US)

(72) Inventors: Aleksandar Aleks Aleksov, Chandler, AZ (US); Mauro Kobrinsky, Portland, OR (US); Johanna Swan, Scottsdale, AZ (US); Rajendra C. Dias, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 227 days.

(21) Appl. No.: 14/227,805

(22) Filed: Mar. 27, 2014

(65) Prior Publication Data

US 2015/0282321 A1    Oct. 1, 2015

(51) Int. Cl.
*H05K 1/00* (2006.01)
*H05K 1/14* (2006.01)
(Continued)

(52) U.S. Cl.
CPC .......... *H05K 1/142* (2013.01); *H01L 24/78* (2013.01); *H05K 1/0284* (2013.01);
(Continued)

(58) Field of Classification Search
CPC . H01L 2224/85399; H01L 2224/05599; H01L 2224/48472; H01L 2224/48091;
(Continued)

(56) References Cited

U.S. PATENT DOCUMENTS 4,388,672 A  *  6/1983  Skill .................. H04R 1/04
                                                        361/739
5,032,737 A     7/1991  Holm et al.
(Continued)

FOREIGN PATENT DOCUMENTS

CN       1904669 A    1/2007
CN     104952826 A    9/2015
(Continued)

OTHER PUBLICATIONS

"Microbonds X-Wire Bonding Wire Technology", Example for insulated wire bond process:, [Online]. Retrieved from the Internet: <URL: http://www.microbonds.com/xwiretech.htm, 2 pgs.
(Continued)

*Primary Examiner* — Timothy Thompson
*Assistant Examiner* — Guillermo Egoavil
(74) *Attorney, Agent, or Firm* — Schwegman Lundberg & Woessner, P.A.

(57) ABSTRACT

Generally discussed herein are systems and apparatuses that can include apparatuses, systems, or method for a flexible, wire bonded device. According to an example an apparatus can include (1) a first rigid circuit comprising a first plurality of bond pads proximate to a first edge of the first rigid circuit, (2) a second rigid circuit comprising a second plurality of bond pads proximate to a first edge of the second rigid circuit, the second rigid circuit adjacent the first rigid circuit and the first edge of the second rigid circuit facing the first edge of the first rigid circuit, or (3) a first plurality of wire bonded wires, each wire bonded wire of the first plurality of wire bonded wires electrically and mechanically connected to a bond pad of the first plurality of bond pads and a bond pad of the second plurality of bond pads.

4 Claims, 8 Drawing Sheets (51) Int. Cl.
*H05K 1/02* (2006.01)
*H05K 1/03* (2006.01)
*H05K 1/11* (2006.01)
*H05K 3/46* (2006.01)
*H01L 23/00* (2006.01)

(52) U.S. Cl.
CPC ........... *H05K 1/0393* (2013.01); *H05K 1/117* (2013.01); *H05K 1/148* (2013.01); *H05K 3/4691* (2013.01); *H01L 2224/05599* (2013.01); *H01L 2224/16225* (2013.01); *H01L 2224/4809* (2013.01); *H01L 2224/48091* (2013.01); *H01L 2224/48465* (2013.01); *H01L 2224/48472* (2013.01); *H01L 2224/85399* (2013.01); *H01L 2924/00014* (2013.01); *H05K 2201/10287* (2013.01); *Y10T 29/49126* (2015.01)

(58) Field of Classification Search
CPC ........... H01L 2224/16225; H01L 24/78; H01L 2224/4809; H01L 2224/48465; H01L 21/568; H01L 2223/6622; H01L 2224/484; H01L 2224/8592; H01L 2224/4917; H01L 2224/05554; H01L 2224/05624; H01L 2224/05639; H01L 2224/05644; H01L 2224/05647; H01L 2224/05655; H01L 2224/05657; H01L 2224/05664; H01L 2224/06153; H01L 2224/32225; H01L 2224/45015; H01L 2224/45124; H01L 2224/45139; H01L 2224/45144; H01L 2224/45147; H01L 2224/45155; H01L 2224/45565; H01L 2224/48137; H01L 2224/48227; H01L 2224/48233; H01L 2224/48599; H01L 2224/48639; H01L 2224/48644; H01L 2224/48647; H01L 2224/48655; H01L 2224/48657; H01L 2224/48664; H01L 2224/48699; H01L 2224/48739; H01L 2224/48747; H01L 2224/48755; H01L 2224/48757; H01L 2224/48764; H01L 2224/48744; H01L 2224/48839; H01L 2224/48847; H01L 2224/48844; H01L 2224/48855; H01L 2224/48857; H01L 2224/48864; H01L 2224/49113; H01L 2224/49431; H01L 2224/73265; H01L 2225/1035; H01L 2225/1058; H01L 23/3107; H01L 24/06; H01L 24/45; H01L 24/48; H01L 24/49; H01L 24/73; H01L 24/85; H01L 25/105; H01L 25/0655; H01L 2924/14; H01L 2924/014; H01L 2924/181; H01L 2924/0105; H01L 2924/1517; H01L 2924/3011; H01L 2924/00014; H01L 2924/01004; H01L 2924/01005; H01L 2924/01006; H01L 2924/01013; H01L 2924/01014; H01L 2924/01023; H01L 2924/01027; H01L 2924/01028; H01L 2924/01029; H01L 2924/01033; H01L 2924/01046; H01L 2924/01047; H01L 2924/01052; H01L 2924/01078; H01L 2924/01079; H01L 2924/01082; H01L 2924/01083; H01L 2924/09701; H01L 2924/10253; H01L 2924/15311; H01L 2924/15787; H01L 2924/16152; H01L 2924/18165; H01L 2924/19041; H01L 2924/19042; H01L 2924/19043; H01L 2924/20752; H01L 2924/30105; H01L 2924/30107; H05K 1/0284; H05K 2201/10287; H05K 1/148; H05K 3/4691; H05K 1/0393; H05K 1/142; Y10T 29/49126

USPC ....... 257/208, 692, 698, 723, 725, 776, 784, 257/E23.124, E23.025, E25.023, E25.12; 361/760

See application file for complete search history.

(56) References Cited

U.S. PATENT DOCUMENTS

| | | | |
|---|---|---|---|
| 5,373,108 A | 12/1994 | Ysbrand | |
| 5,442,519 A * | 8/1995 | DeBalko | H04M 3/18 361/772 |
| 5,723,906 A * | 3/1998 | Rush | H01L 24/06 257/203 |
| 6,471,415 B1 * | 10/2002 | Poorman | G11B 5/10 385/59 |
| 2002/0070446 A1 * | 6/2002 | Horiuchi | H01L 21/568 257/723 |
| 2002/0171133 A1 * | 11/2002 | Mok | G01R 1/06711 257/678 |
| 2004/0084771 A1 * | 5/2004 | Bolken | H01L 25/105 257/738 |
| 2007/0025710 A1 * | 2/2007 | Shin | H04N 5/2253 396/55 |

FOREIGN PATENT DOCUMENTS

| | | |
|---|---|---|
| DE | 102011080153 A1 | 7/2011 |
| EP | 1750429 A1 | 2/2007 |
| JP | 09083100 A | 3/1997 |
| JP | 2002184934 A | 6/2002 |
| JP | 2007037094 A | 2/2007 |
| JP | 2008091776 A | 4/2008 |
| JP | 2012515436 A | 7/2012 |
| KR | 1020020046966 A | 6/2002 |
| KR | 1020070014919 A | 2/2007 |
| WO | WO-2010081137 A2 | 7/2010 |

OTHER PUBLICATIONS

"European Application Serial No. 15155076.1, Extended European Search Report mailed Sep. 19, 2015", 7 pgs.
"Japanese Application Serial No. 2015-029117, Office Action mailed Mar. 22, 2016", W/ English Translation, 9 pgs.
"Korean Application Serial No. 2015-0028535. Response filed Oct. 14, 2016 to Office Action mailed Aug. 17, 2016", W/ English Translation of Claims. 23 pgs.

* cited by examiner

FLEXIBLE ELECTRONIC SYSTEM WITH WIRE BONDS

TECHNICAL FIELD

Examples generally relate to flexible circuit architectures and methods. More specifically, examples relate to using wire bonds to create a flexible circuit architecture.

TECHNICAL BACKGROUND

Wearable electronic systems can be flexible to help the electronic system conform to body curvature(s). In many cases the bending must be repeatable. For example, in a bracelet system, the bracelet can conform to the curvature of the human body part that the bracelet goes around when worn or can be nearly or entirely flat when not being worn. The shape of the part can vary from person to person, thus making the flexibility of the bracelet important so that a single bracelet can fit a variety of body parts.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Examples in this disclosure relate generally to flexible circuit architectures and methods. More specifically, examples relate to using wire bonds to create a flexible circuit architecture.

Discussed herein is a reduced cost method to obtain a flexible (e.g., bendable) electric (e.g., electronic) system, such as can be used for wearable electric systems or the "internet-of-things". A problem with current flexible electric systems includes a lack of deformable, conductive interconnects between rigid parts of the flexible electric system. Another problem with current flexible electric systems is a prohibitive cost to manufacture the system. To be more widely marketable, flexible electric systems should be manufactured at a reduced cost with respect to current manufacturing costs.

A desirable characteristic of flexible (e.g., wearable) electric systems is the ability to use a diverse array of electric components in the flexible electric system. Radios and sensors can be part of a flexible system, so as to allow a currently rigid system, such as a smart phone, to be implemented in a flexible electric form. Many current electric components come pre-packaged, or are only available in a certain form of packaging.

An approach to making a wearable electric system out of currently available components can benefit from a technique or architecture that allows a wide variety of shapes and sizes of electric components to be used therewith. For example, a communications sub-system or radio can include a plurality of small individual chips such as a power amplifier, a low noise amplifier, or a digital to analog converter, among others. Each of these components can be, for example, wire bonded to a substrate and packaged for surface mounting, such as in a Surface Mount (SMT) package. As many of these sorts of systems, apparatuses, or components are pre-packaged and can be cost efficient, a wearable system that allows prepackaged components to be used therein can be beneficial.

Figure 1:
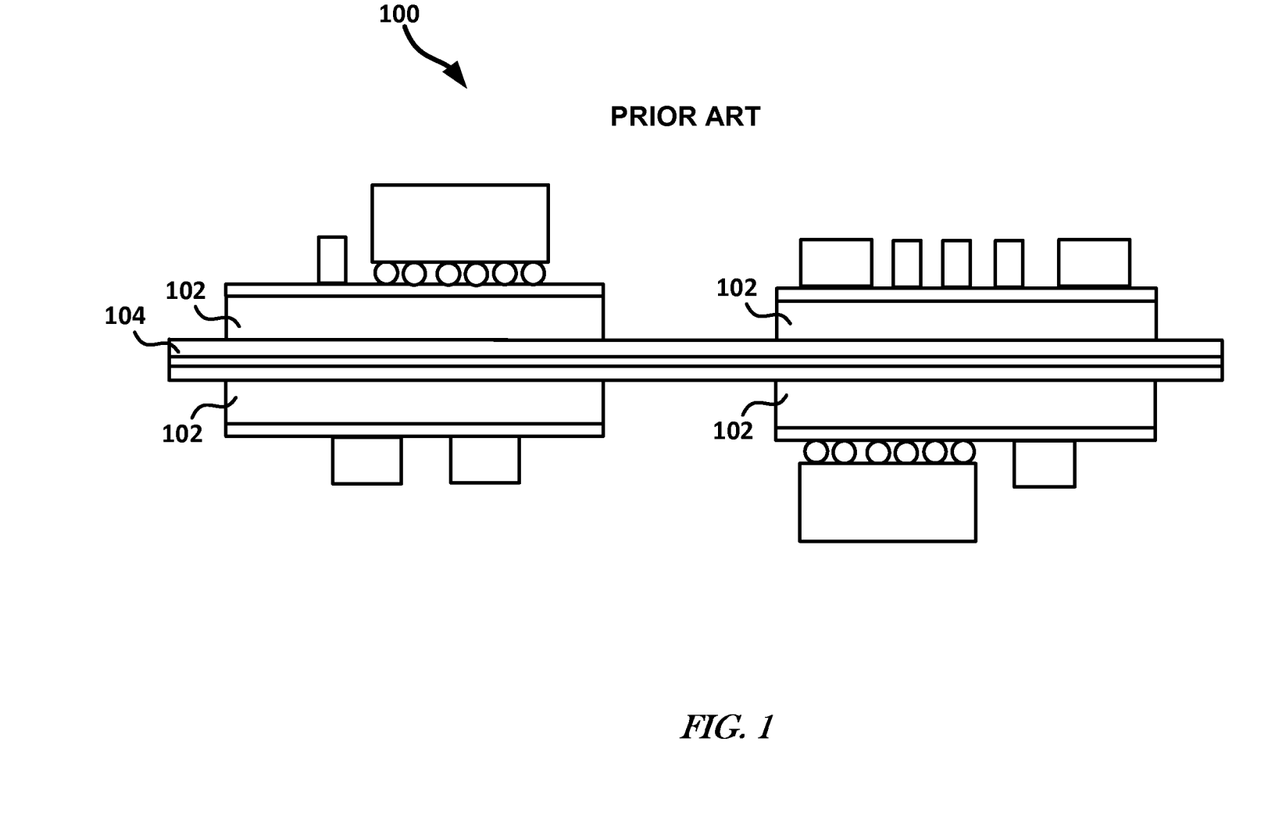
FIG. 1 shows a block diagram of a prior art flexible circuit.

FIG. 1 shows a block diagram of an example of a prior art flexible system 100. The system 100 includes a combination of a rigid board 102 and a flex board 104 technology. As used herein "rigid" means either not bendable or an area that has a bending radius that is significantly larger than a bending radius required to conform to a curved surface of interest.

The flex board 104 is integrated (i.e. merged) with the rigid board 102 using vias or Plated Through Holes (PTH). A problem with this technology includes a cost that is higher than the cost goals for flexible systems. Another problem with such a flexible system, can include "winding" the traces in a sort of spring pattern on the flexible board 102 so that the traces do not break when the flexible board 102 is bent. The routing and plating of such traces is more complicated and consumes more real space than in a non-flexible system or in a flexible system that does not include traces on a flexible board.

In contrast to the prior art flexible circuit systems, wire bonded wires can provide a flexible interconnect between rigid circuit segments, such as to provide a system (e.g., a wearable system) that can be composed of rigid circuit (e.g., non-bendable) segments. The rigid circuit segments can be homogeneous, heterogeneous, or a combination thereof. A system with wire bonds between rigid circuit segments can provide both flexibility and interconnect density, two parameters that are usually in conflict with each other in bendable and to a certain degree, stretchable systems.

The conflict can be explained as follows. In a bendable system, the interconnects are generally comprised of metals, such as copper (Cu), that have an elongation in an elastic region that is small or negligible (e.g., Cu<0.1%). Straight Cu interconnects can undergo plastic yielding with very low deformations, which can result in interconnect cracking A common solution to this problem is to use meandering traces (i.e. two-dimensional spring-like or meandering traces). However, these meandering traces can take up a significant amount of space, thus limiting the frequency of the interconnect lines and reducing the trace density. The distance between the meandering traces can depend on the trace width, and can reach values above one millimeter. Another shortcoming of meandering interconnect lines can include deformation and stress concentrations occurring where the meandering lines connect to the rigid circuit segments, creating weak points that can reduce the reliability of the entire system.

Another solution includes the so called rigid-flex, such as shown in FIG. 1, which currently is relatively costly and from a manufacturing perspective, is certainly more costly than using wire bonding to connect rigid circuit segments.

Wire bonding technology is considered to be cost effective, especially if Cu or aluminum (Al) wires are used. Wire bonding can provide a segment (e.g., rigid circuit) to segment interconnect at a reduced cost or at a higher density than meandering traces. In addition, any packaging technology (e.g., rigid segments) can be interconnected together to form a bendable or flexible system, as long as the packaging technology includes pads to which wires can be wire bonded.

One feature of a wire bonded circuit system is that heterogeneous components can be connected using wire bonds. There are at least two advantages that this capability can provide. One is that different components, such as a processor (e.g., Central Processing Unit (CPU)), a memory, a radio, a Micro ElectroMechanical System (MEMS), wireless, graphics, chipset, or an analog component are typically assembled using different technologies. (e.g., wire bonding, surface mount, or BGA, among others). By adjusting a package design (if necessary) so that at least the facing sides of directly adjacent rigid circuits include wire bond pads, a flexible system can be built without necessitating a uniform packaging technology. Another advantage is that existing, off-the-shelf components, or rigid circuit segments can be used, such as to reduce cost and time to market. The wire bonded wires can be sufficiently long to enable bendability. During the wire bonding process the wires can be guided such as to allow for additional length or limited spring-characteristics for multiple bending cycles. Multiple bending cycles is in contrast to systems with wires that need to be bent only once. A single bending cycle can be realized in a bracelet system where the electronics are bent as they are mounted in a bent case and never bent again.

Figure 2A:
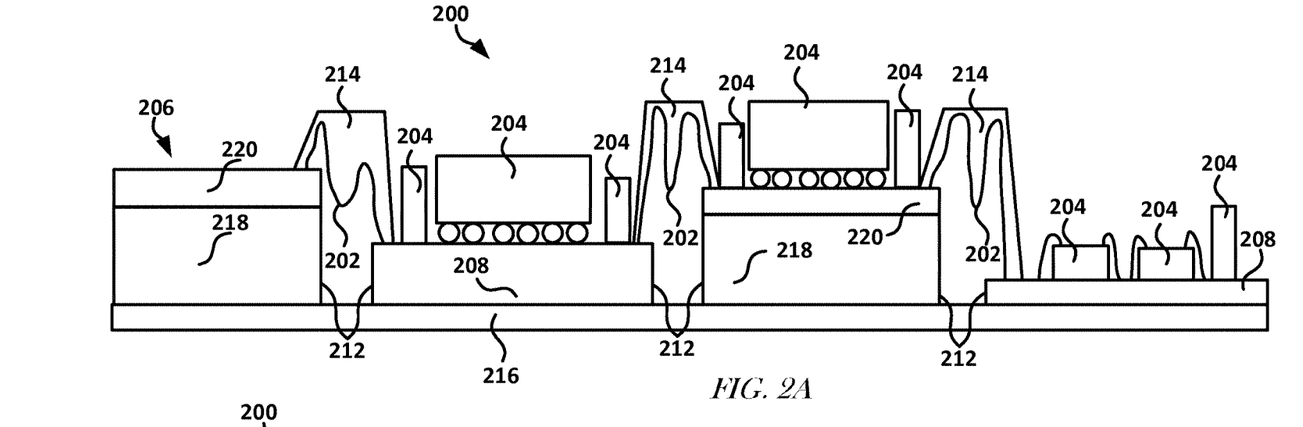
FIG. 2A shows a block diagram of a side view of an example of a flexible circuit according to one or more embodiments.
Figure 2B:
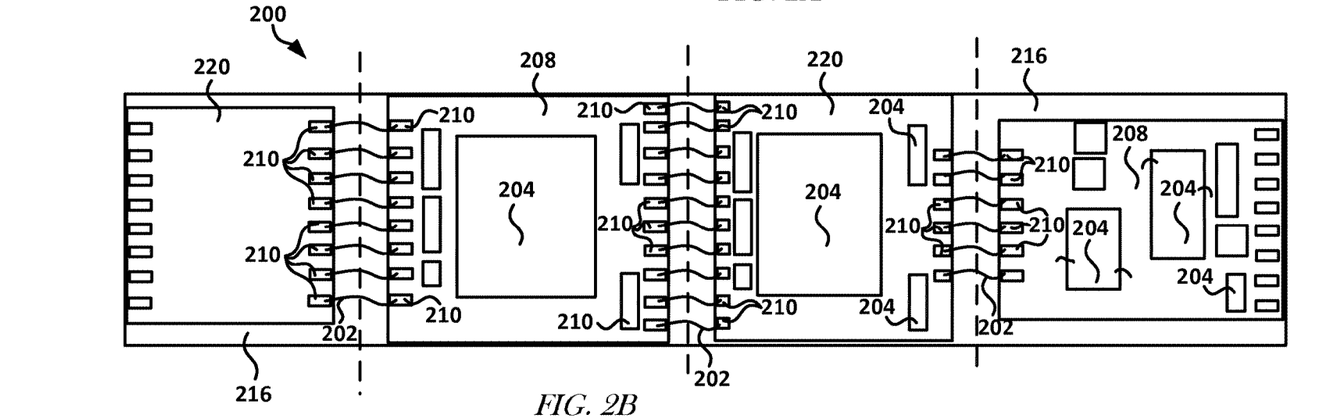
FIG. 2B shows a block diagram of a top view of an example of a flexible circuit according to one or more embodiments.

FIG. 2A shows a block diagram of a side view of an example of a system 200 that can include wire bonded wires 202, according to one or more embodiments. FIG. 2B shows a block diagram of a top view of an example of the system 200 of FIG. 2A.

The system 200 can include a plurality of rigid circuits (e.g., a component 204, a Wafer Level Package (WLP) 206, or a pin out board 208) electrically connected using one or more wires 202 (e.g., through wire bonds). The rigid circuit can include a variety of components of varying shapes and sizes. For example, the rigid circuits can include one or more of components 204, such as can include a flip chip package, a surface mount package, a Ball Grid Array (BGA) package, a PTH part or package (e.g., a Dual In-Line Package (DIP) or a Pin Grid Array (PGA) part or package), a leadless chip part or package, a Thin Small-Outline Package (TSOP) part or package, a Land Grid Array (LGA) part or package, a Printed Circuit Board (PCB) or a combination thereof, among others. The rigid circuit can include a wafer level package 206, such as can include one or more dies or components embedded or integrated in a mold 218. The components in the mold 218 can be electrically coupled during manufacturing of the wafer level package 206. The wafer level package 206 includes an integrated pin out layer 220 that includes a plurality of interconnects (e.g., a wire bond pad, SMT bond pad, flip chip bond pad, BGA bond pad, a male or female connection feature, or the like), such as to provide electrical access to the one or more dies or components embedded in the mold 218. The component 204 can be electrically coupled (e.g., soldered or connected through a mating male or female connection feature) to an interconnect provided in the pin out layer 220.

The wires 202 can be insulated, such as by surrounding the wire with a dielectric material or other insulator, such as a plastic, a polymer, or a dielectric (e.g., silicon dioxide or silicon nitride), among others. The wire can be spray coated with an insulating or dielectric material, such as before or after wire bonding the wire. This material can be dried or cured after the spray coating.

The wires 202 can be encapsulated in an insulating material 214. The insulating material 214 can include an elastomer material, such as a PolyDiMethylSiloxane (PDMS) or a synthetic rubber, among others. Using insulated wires or encapsulated wires can help prevent a short circuit or help increase the longevity or ruggedness of the wires 202. A wire with an increased ruggedness can include a wire that can be bent more times or bent in a manner that would not otherwise be allowed without the wire breaking.

The wires 202 can be include Au, Cu, Al, or alloys thereof, among others. Other materials may be used if a wire bond process for them is available, and if the mechanical properties allow bending. If the bending is limited to a single time (for instance to fit the system into a rigid casing, such as i.e. a ring), pure Al may also be used as a low cost alternative.

The pin out board 208 (e.g., PCB) can include a plurality of bond pads 210 situated thereon. The bond pads 210 can be electrically coupled to a trace, via, or component 204, such as to provide electrical access to the component, trace, or via. The bond pads 210 can be configured for attaching a wire thereto, such as through wire bonding. The bond pads 210 can be proximate an edge 212 of the pin out board 208. The bond pads 208 proximate an edge of a first pin out board can include the same number of bond pads as a number of bond pads proximate an edge of a second pin out board that is directly adjacent to the side of the first pin out board, such as shown in FIG. 2B. The edge of the first pin out board that includes the bond pads proximate thereto can face the edge of the second pin out board that includes the bond pads proximate thereto. The bond pads 210 can be situated anywhere on the pin out board 208. That is, the bond pads 210 do not need to be situated proximate the edge of the pin out board 208, but can be situated more central to the pin out board 208 than proximate the edge.

The bond pads 210 can include a pitch that allows for a needed length of the wire-bond wire (e.g., depends on bending radius of the wire or the rigid circuit segment). The bond pad pitch can be between about forty-five micrometers and about sixty-five micrometers. The bond pads 210 can be a standard size. A bond pad size used can be a function of a minimum pitch. The bond pad size or shape does not need to be the same for all pads. The wire bond pads 210 can include one or more rows of bond pads, such as can be dependent on a needed or desired interconnect density. The surface of the bond pads 210 can be any conductor (e.g., metal) that can used as a surface finish for wire bonding and is compatible with the wire 202. Materials for surface finishes include, but are not limited to: gold (Au), Cu, Al, palladium (Pd), stacks thereof, or combinations thereof.

The rigid circuits can be situated on, or at least partially in an flexible carrier 216. The flexible carrier 216 or the insulating material 214 can help stabilize the system 200, such as by providing the system 200 with more rigidity than would be provided without the flexible carrier 216 or the insulating material 214. The flexible carrier 216 can help limit the flexibility of the system 200, such as to help protect the wires 202 from breaking. The flexible carrier 216 can include a flexible adhesive tape material. In general, the flexible carrier 216 can include any flexible material that the rigid circuits can be mounted on, such as by glue, epoxy, solder, or other adhesive. The flexible carrier 216 may not be needed for mechanical rigidity. The flexible carrier 216 can help define a distance between the components (e.g., rigid circuit segments, and can help prevent breaking of the wire bond wires or stress on the wire bond connection. The flexible carrier 216 can include elastomer, resin, a polymer (e.g., Polyethylene Terephthalate (PET), PolyDiMethylSiloxane (PDMS), or Polyimide (PI)), or a combination thereof.

Using the system 200, different package technologies can be interconnected with wire bonds, enabling bendability in the wire bond regions. The system 200 can be prone to wire-bond breaking, as the system can be held together by just the wire bonds. The components (e.g., rigid circuit segments) can be mounted on the flexible carrier 216 (e.g., an adhesive tape or where the flexible carrier includes no electrical functionality). The flexible carrier 216 can have cut outs or recesses therein to fit components therein or therethrough. The flexible carrier 216 can provide mechanical support for the wire bond wires.

The rigid circuits can be rotated or displaced translationally (e.g., to increase a distance between two rigid circuits) with respect to one another. The rigid circuits can rotate, with respect to another rigid circuit, about an axis that is generally parallel or perpendicular to one of their edges. Note that rotation or translation of one rigid circuit with respect to another is generally arbitrary and not limited to rotation about an axis that is perpendicular or parallel to an edge of the rigid circuit. For example, if an edge of one rigid circuit is set at a thirty degree angle with respect to an edge of another rigid circuit, the rotational axis may not be generally parallel or perpendicular to an edge of either rigid circuit. One or more edges of a rigid circuit may or may not be substantially parallel to an edge of an adjacent second rigid circuit.

Wire bonding is a well-established technique to provide electrical interconnects between components. Two or more rigid circuit segments interconnected by wire bonded wires can be rotated relative to each other and can provide a flexible, stretchable, or bendable system. The bending radius or angle of a bend can be limited by the length of a shortest wire in a given set of wire bonds or the distance between the two rigid circuit segments that the wire of the wire bond connects. A system that includes wire bonded wires between rigid circuit segments can help enable the "Internet of Things" (i.e. the internetworking of objects) by creating a flexible (e.g., wearable) system that includes a reduced development time (e.g., as compared to the system of FIG. 1), such as by allowing a way to interconnect existing rigid circuit segments or components packaged with various packaging techniques. A small design change may be needed to add traces connected to bond pads that can be wire-bonded to, so as to provide electrical access to one or more components of the component or the rigid circuit segment.

Figure 3A:
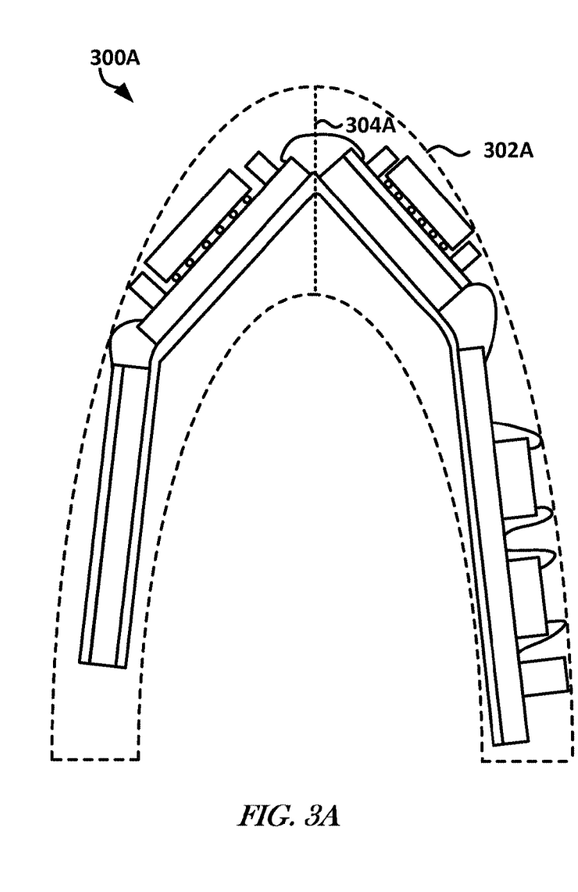
FIG. 3A shows a block diagram of an example of a flexible circuit according to one or more embodiments.
Figure 3B:
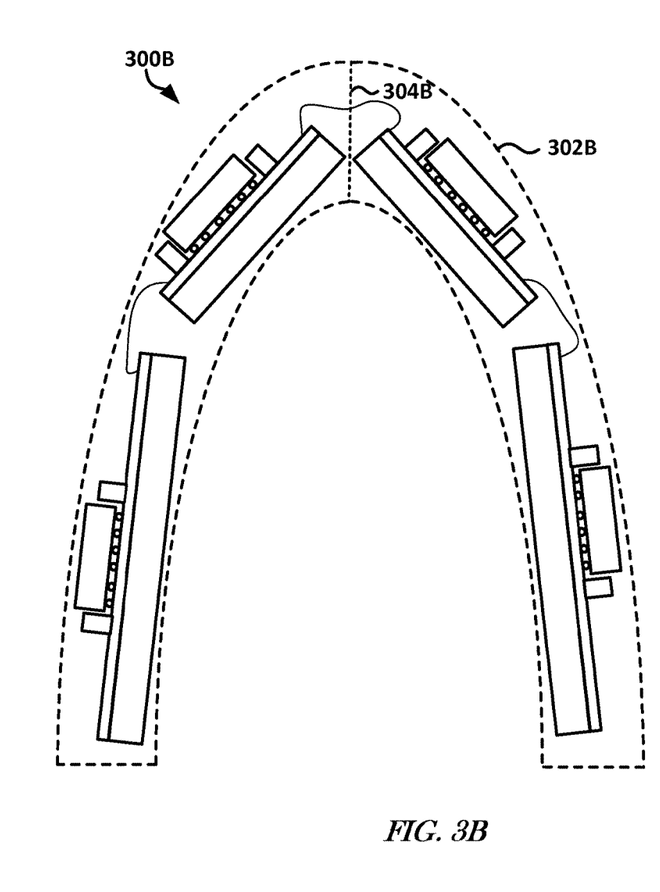
FIG. 3B shows a block diagram of an example of another flexible circuit according to one or more embodiments.

FIGS. 3A and 3B illustrate block diagrams of examples of how a wire bonded flexible or bendable system 300A and 300B, respectively, can look when bent. The system 300A-B can be bent (e.g., flexed) to fit into a bracelet, ring, earring, glasses, clothing, or pendant, among others. The housing, or part of the housing, into which the system 300A-B can fit is outlined with the dashed lines 302A and 302B, respectively.

The system 300A-B can also be bent in the opposite direction and in many other configurations. The system 300A of FIG. 3A is more heterogeneous (e.g., includes rigid circuit segments that have a greater variety of lengths, widths, or heights) than the system 300B of FIG. 3B. FIG. 3B illustrates a bent system 300B in which the rigid circuit segments are manufactured using a similar or same packaging technology, such as to make the overall lengths, widths, or heights of the rigid circuit segments substantially the same. By including rigid circuit segments that include overall lengths, widths, or heights that are more homogeneous, an overall maximum form factor (indicated by the dotted arrow 304A and 304B, respectively) an be reduced. A reduced form factor can provide more space for other components, such as a battery or can reduce the overall thickness of the system 300A-B, such as to create a system 300A-B with a smaller overall profile.

Figure 4:
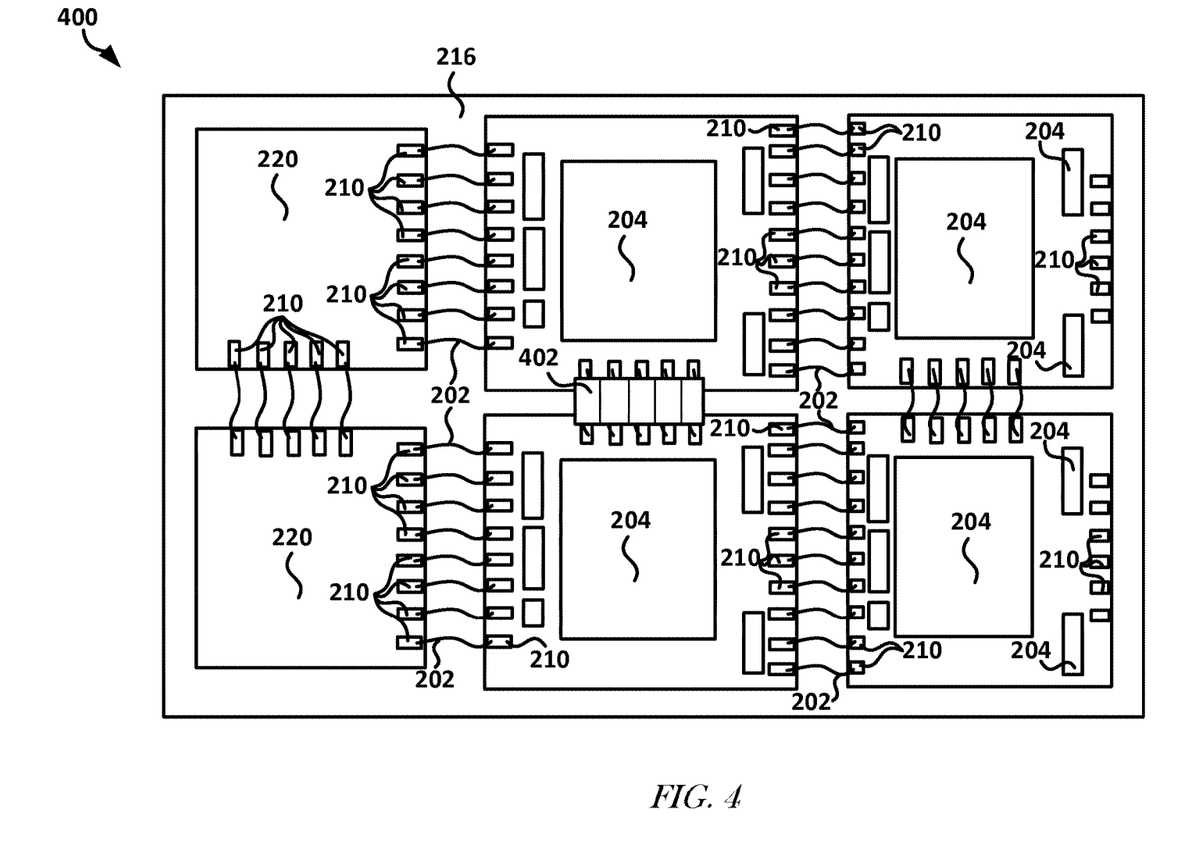
FIG. 4 shows a block diagram of an example of a two dimensional system according to one or more embodiments.

While the FIGS. 2A, 2B, 3A, and 3B generally illustrate one dimensional bendable systems (e.g., generally linear systems), it will be understood that two or even three dimensional systems can be built using techniques of this disclosure. To build a two dimensional system, the bond pads on one rigid circuit segment can be on two sides (e.g., perpendicular sides) that share a common vertex. An example of such a two dimensional system is shown in FIG. 4. To build a three dimensional system, a two dimensional system can include a one dimensional or another two dimensional system stacked thereon, such by using a material to support the stacked system or provide space between the two systems.

FIG. 4 shows a block diagram of an example of a two dimensional system 400 according to one or more embodiments. The system 400 can include a plurality of rigid circuit segments. Each rigid circuit segment can include a plurality of bond pads proximate an edge of the rigid circuit segment. A plurality of wires to be wire bonded can be encased in an insulated ribbon 402. The insulated ribbon 402 can be generally flat. The wires 202 in the insulated ribbon can be situated side-by-side, such as with a distance between adjacent wires being approximately the same as a distance between centers of adjacent bond pads which the wires are to be wire bonded to.

Figure 5:
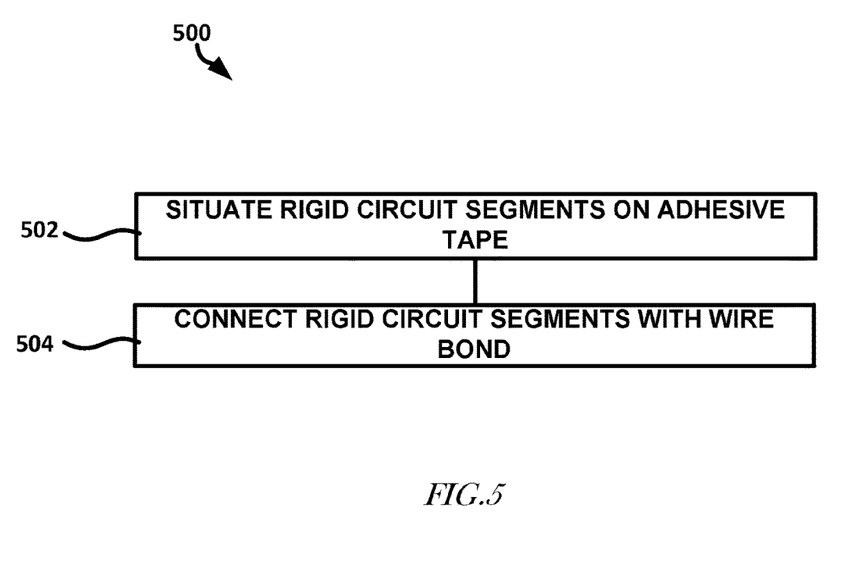
FIG. 5 shows a flow diagram of a technique for making a flexible circuit according to one or more embodiments.

FIG. 5 shows a flow diagram of a technique 500 for manufacturing a bendable or flexible system according to one or more embodiments. At 502, rigid circuit segments can be situated on a flexible carrier. At 504, rigid circuit segments can be electrically or mechanically connected with a wire bond. The wires to be wire bonded can be pre-insulated, such as by using a wire with an insulating coating. The technique 500 can include spray coating an insulating material onto the wire bonded wires. Spray coating can be completed over substantially the entire surface of the system, such as to protect the system with an insulator (e.g., dielectric) material. The spray coating can be limited to the wire bonds, such as to only insulate the wires or the wire bonds. The insulating material can be deposited onto the rigid circuit segments and the flexible carrier. The insulating material may not adhere to nonmetallic areas. In such a case, the insulating material can be removed, such as by blowing or spraying the insulating material away. The insulating material can include a polymer or a similar material. Additives to the polymer can provide control of the viscosity of the insulating material, wetting to the metal wires, or thickness of the coated insulating material, such as after drying or curing. The spray coating process and material can be tailored in its properties so that after drying or curing the final insulating material has a desired thickness, such as between about one hundred nanometers and ten micrometers. Even when using a wire with an insulated coating, the wire bond (e.g., the electrical or mechanical connection between the wire and the rigid circuit segment) can still be exposed (e.g., not insulated). This exposed portion of the wire bond can be insulated by spray coating or other technique of coupling an insulating material to the wire bond.

The technique 500 can include molding a region between wire bonded wires or rigid circuit segments with a molding material, such as an elastomer material. The thickness of the molding material can be such that the wire bonded wires are covered (e.g., entirely covered). The technique 500 can include curing the molding material.

The following description regards techniques for making a wire bond.

In stretchable (e.g., bendable or wearable) electronics interconnects between a rigid material (e.g., a silicon die) and stretchable traces on a stretchable substrate need to be made compliant to accommodate a strain at an interconnection region, such as to prevent interconnection failure, such as during stretching (e.g., cyclic stretching) of the electronics. In a state of the art wire bond process, wire bond interconnects tend to fail at the neck of the wire bond. Another problem faced in the state of the art wire bond process can include making a robust wire bond joint on a component (e.g., die) placed on a soft or compliant material, such as PolyDiMethylSiloxane (PDMS). An ultrasonic or thermosonic wire bond requires the substrate to be rigid during the wire bonding process. This is an industry wide problem and no known effective solutions have been published.

Figure 6:
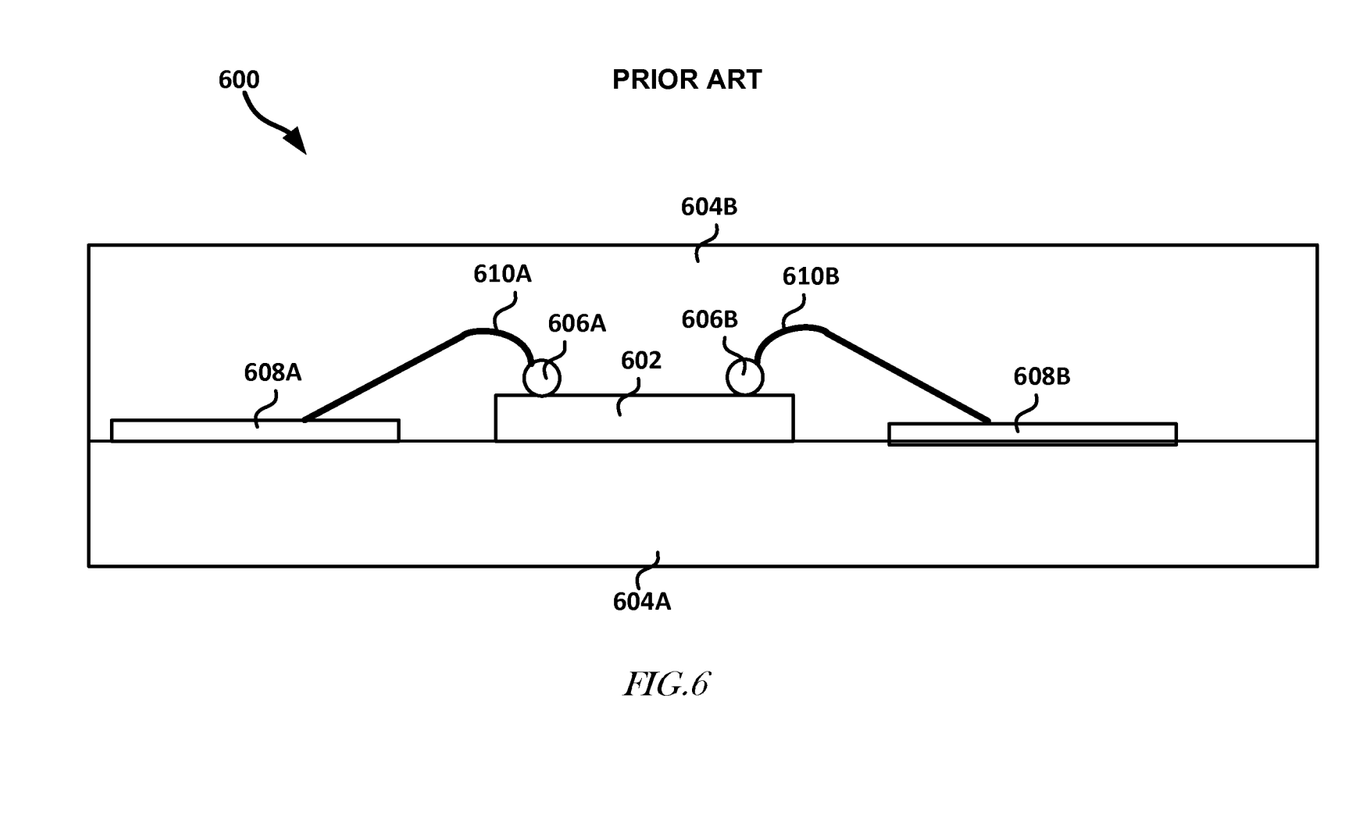
FIG. 6 shows a block diagram of a prior art wire bond.

FIG. 6 shows a block diagram of a prior art system 600 that includes a wire bond. The system 600 can include a wire bonded die 602 encapsulated in a stretchable material 604A or 604B, such as PDMS.

Figure 7:
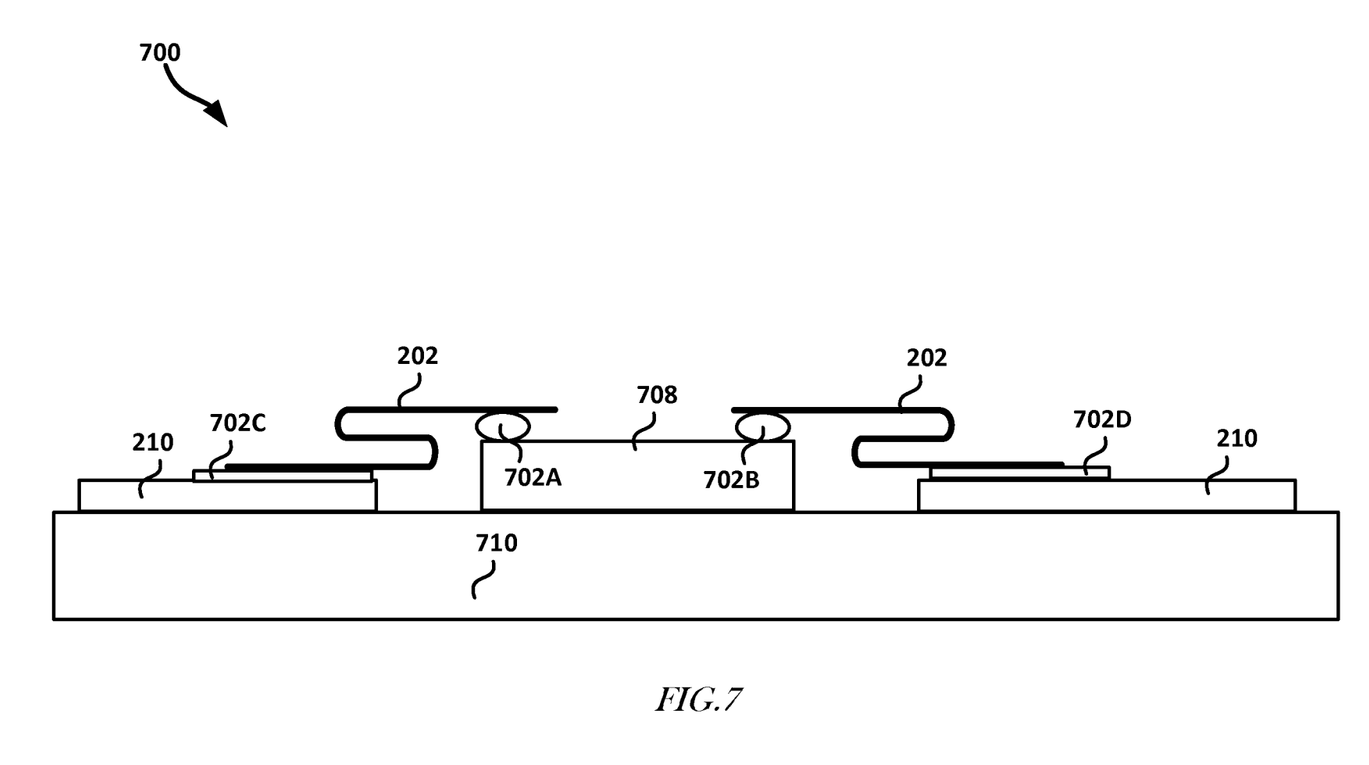
FIG. 7 shows a block diagram of an example of a wire bond according to one or more
Figure 8:
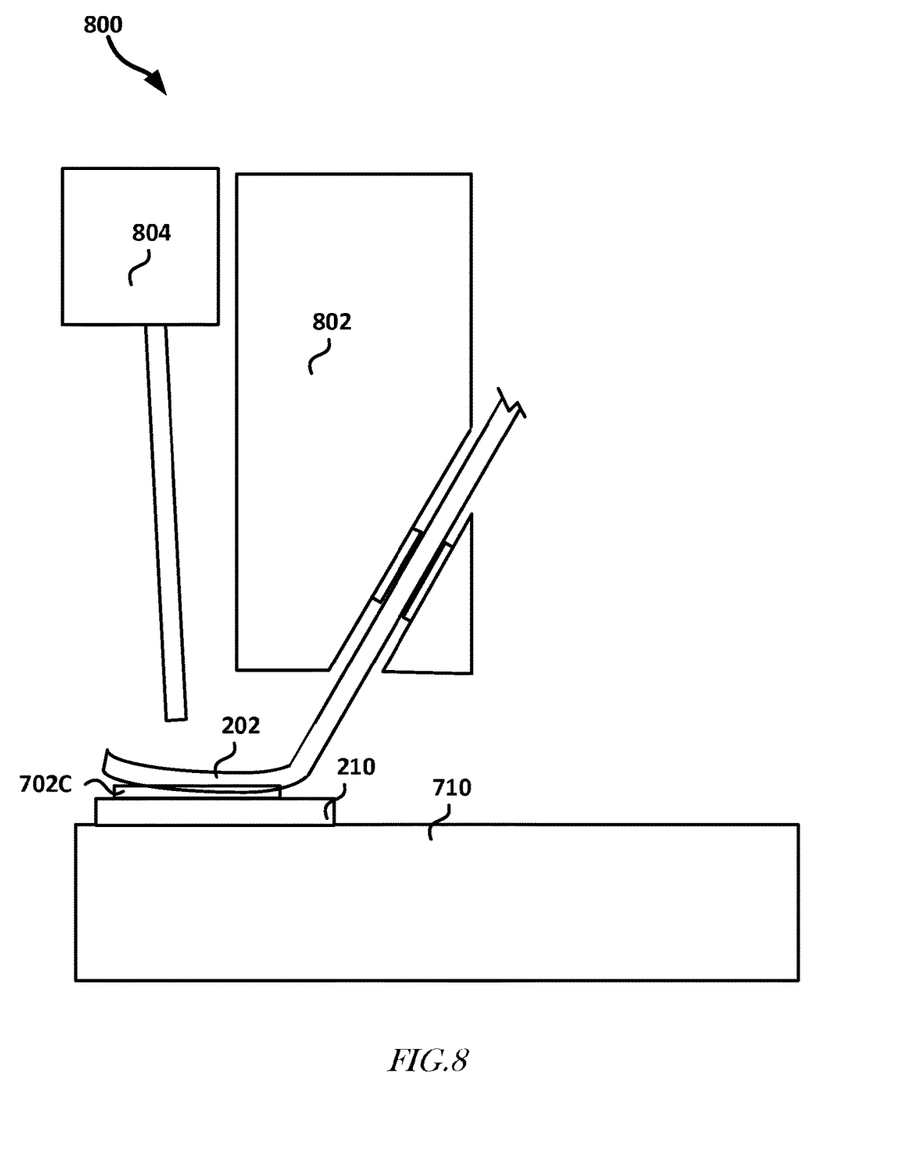
FIG. 8 shows a block diagram of an example of a system for wire bonding a wire to a bond pad.

FIG. 7, shows a block diagram of an example of a wire bonded system 700, according to one or more embodiments. FIG. 8 shows an example of a system for creating a wire bond according to one or more embodiments.

One or more bond pads 210 can be situated on a substrate 710 (e.g., a compliant substrate such as PDMS). A soft or conductive material 702A, 702B, 702C, or 702D, such as solder or adhesive conductive material (e.g., Anisotropic Conductive Film (ACF)) can be applied to a die pad (e.g., on the top of a die 708 below the soft compliant material 702A-B) and a wire bond pad 210. A wedge bonder 802 can be used to firmly place a wire 202 on the compliant material 702A-D. The wire 202 and compliant material 702A-D can be heated, such as locally heated by a fiber laser 804, to make a metallurgical spot solder joint. The material in the area where there is a connection between the compliant material 702A-D, the wire 202, and the pad 210 can be considered a bond joint. The conductive material 702A-D can include a low temperature solder such as tin bismuth (SnBi).

The wedge bonder 802 can be used to make a wire 202 meander between the die 708 and wire bond pad 210 to accommodate stretching of the substrate 710, such as during use conditions. The wire 202 can include one or more wires in a round or flat ribbon 402. The flat ribbon 402 can help increase a contact area between the wire 202 and the pad 210.

The force used to keep the wire 202 in place can be adjusted to allow the wire 202 to make a firm contact with the compliant material 702A-D, the die 708, die pad, or the pad 210, such as without causing the die pad or trace pad to deform or depress in the substrate 710. A metallurgical bond can be made by laser spot soldering while the wire is held down by the wedge bonder 802 (e.g., a capillary).

Laser soldering can be accomplished using an UltraViolet (UV), Infrared (IR), or a green laser, among others. A fiber laser can be attached to the wire bond capillary of the wedge bonder 802 or placed near the wire bond capillary. The laser 804 can be moved in tandem with the wedge bonder 802.

EXAMPLES AND NOTES

The present subject matter may be described by way of several examples.

Example 1 can include or use subject matter (such as an apparatus, a method, a means for performing acts, or a device readable memory including instructions that, when performed by the device, can cause the device to perform acts), such as can include or use (1) a first rigid circuit comprising a first plurality of bond pads proximate to a first edge of the first rigid circuit, (2) a second rigid circuit comprising a second plurality of bond pads proximate to a first edge of the second rigid circuit, the second rigid circuit adjacent the first rigid circuit and the first edge of the second rigid circuit facing the first edge of the first rigid circuit, or (3) a first plurality of wire bonded wires, each wire bonded wire of the first plurality of wire bonded wires electrically and mechanically connected to a bond pad of the first plurality of bond pads and a bond pad of the second plurality of bond pads such that the first rigid circuit is free to rotate with respect to the second rigid circuit about a rotational axis generally parallel to the first edge of the first rigid circuit.

Example 2 can include or use, or can optionally be combined with the subject matter of Example 1, to include or use a flexible carrier, wherein the first rigid circuit and the second rigid circuit are situated on the flexible carrier.

Example 3 can include or use, or can optionally be combined with the subject matter of at least one of Examples 1-2, to include or use insulating material covering substantially all of the first plurality of wire bonded wires.

Example 4 can include or use, or can optionally be combined with the subject matter of at least one of Examples 1-3, to include or use insulating material covering wire bond joints on the first plurality of bond pads.

Example 5 can include or use, or can optionally be combined with the subject matter of at least one of Examples 1-4, to include or use a molding material surrounding the first plurality of wire bonded wires in a region between the first rigid circuit and the second rigid circuit.

Example 6 can include or use, or can optionally be combined with the subject matter of at least one of Examples 1-5, to include or use, wherein the first rigid circuit further comprises a third plurality of bond pads situated proximate a second edge of the first rigid circuit, wherein the first edge of the first rigid circuit is opposite the second edge of the first rigid circuit. Example 6 can include or use (1) a third rigid circuit comprising a fourth plurality of bond pads situated proximate a first edge of the third rigid circuit, the first edge of the third rigid circuit facing the second edge of the first rigid circuit, or (2) a second plurality of wire bonded wires, each wire bonded wire of the second plurality of wire bonded wires electrically and mechanically connected to a bond pad of the third plurality of bond pads and a bond pad of the fourth plurality of bond pads such that the third rigid circuit is free to rotate with respect to the first rigid circuit about a rotational axis generally parallel to the second edge of the first rigid circuit.

Example 7 can include or use, or can optionally be combined with the subject matter of Example 6, to include or use a flexible carrier, wherein the first rigid circuit, second rigid circuit, and third rigid circuit are situated on the flexible carrier.

Example 8 can include or use, or can optionally be combined with the subject matter of at least one of Examples 1-7, to include or use, wherein the first plurality of wires are mostly encapsulated, side-by-side, in a generally flat insulated ribbon.

Example 9 can include or use subject matter (such as an apparatus, a method, a means for performing acts, or a device readable memory including instructions that, when performed by the device, can cause the device to perform acts), such as can include or use (1) situating a first rigid circuit on an flexible carrier, the first rigid circuit including a first plurality of bond pads situated proximate a first edge of the first rigid circuit, (2) situating a second rigid circuit on the flexible carrier, the second rigid circuit comprising a second plurality of bond pads proximate to a first edge of the second rigid circuit, the first edge of the second rigid circuit facing the first edge of the first rigid circuit, or (3) wire bonding each wire of a first plurality of wires to a respective bond pad of the first plurality of bond pads and a respective bond pad of the second plurality of bond pads such that the first rigid circuit is free to rotate about a rotational axis generally parallel to the first edge of the first rigid circuit.

Example 10 can include or use, or can optionally be combined with the subject matter of Example 9, to include or use spraying an insulating material on the first plurality of wires.

Example 11 can include or use, or can optionally be combined with the subject matter of at least one of Examples 9-10, to include or use spraying insulating material on a wire bond joint on the first plurality of bond pads.

Example 12 can include or use, or can optionally be combined with the subject matter of at least one of Examples 9-11, to include or use situating a molding material around the wire bonded wires in a region between the first rigid circuit and the second rigid circuit.

Example 13 can include or use, or can optionally be combined with the subject matter of at least one of Examples 9-12, to include or use, wherein wire bonding each wire of the plurality of wires includes (1) situating a wire of the plurality of wires in a capillary of a wedge bonder, (2) situating the wire on a compliant adhesive material, or (3) melting the compliant adhesive material.

Example 14 can include or use, or can optionally be combined with the subject matter of at least one of Examples 9-13, to include or use, wherein the compliant adhesive material includes a solder or an Anisotropic Conductive Film (ACF) and melting the compliant adhesive material includes heating the compliant adhesive material using a laser.

Example 15 can include or use, or can optionally be combined with the subject matter of at least one of Examples 9-14, to include or use, wherein (1) the first rigid circuit further comprises a third plurality of bond pads situated proximate a second edge of the first rigid circuit or (2) the first edge and the second edge of the first rigid circuit share a common vertex. Example 15 can include or use (1) situating a third rigid circuit on the flexible carrier, the third rigid circuit comprising a fourth plurality of bond pads situated proximate a first edge of the third rigid circuit, the first edge of the third rigid circuit facing the second edge of the first rigid circuit, or (2) wire bonding each wire of a second plurality of wires to a respective bond pad of the third plurality of bond pads and a respective bond pad of the fourth plurality of bond pads.

Example 16 can include or use subject matter (such as an apparatus, a method, a means for performing acts, or a device readable memory including instructions that, when performed by the device, can cause the device to perform acts), such as can include or use (1) a first rigid circuit comprising a first plurality of bond pads proximate to a first edge of the first rigid circuit and a second plurality of bond pads proximate a second edge of the first rigid circuit, wherein the first edge and the second edge of the first rigid circuit share a common vertex, (2) a second rigid circuit comprising a third plurality of bond pads proximate to a first edge of the second rigid circuit, the second rigid circuit adjacent the first rigid circuit and the first edge of the second rigid circuit facing the first edge of the first rigid circuit, (3) a third rigid circuit comprising a fourth plurality of bond pads proximate a first edge of the third rigid circuit, the first edge of the third rigid circuit facing the second edge of the first rigid circuit, (4) a first plurality of wire bonded wires, each wire bonded wire of the first plurality of wire bonded wires electrically and mechanically connected to a bond pad of the first plurality of bond pads and a bond pad of the third plurality of bond pads such that the first rigid circuit is free to rotate with respect to the second rigid circuit about a rotational axis generally parallel to the first edge of the first rigid circuit, or (5) a second plurality of wire bonded wires, each wire bonded wire of the second plurality of wire bonded wires electrically and mechanically connected to a bond pad of the second plurality of bond pads and a bond pad of the fourth plurality of bond pads.

Example 17 can include or use, or can optionally be combined with the subject matter of Example 16, to include or use an flexible carrier, wherein the first rigid circuit, second rigid circuit, and third rigid circuit are situated on the flexible carrier.

Example 18 can include or use, or can optionally be combined with the subject matter of at least one of Examples 16-17, to include or use insulating material covering substantially all of the first plurality of wire bonded wires.

Example 19 can include or use, or can optionally be combined with the subject matter of at least one of Examples 16-18, to include or use insulating material covering wire bond joints on the first plurality of bond pads.

Example 19 can include or use, or can optionally be combined with the subject matter of at least one of Examples 16-18, to include or use a molding material surrounding the first plurality of wire bonded wires in a region between the first rigid circuit and the second rigid circuit.

The above detailed description includes references to the accompanying drawings, which form a part of the detailed description. The drawings show, by way of illustration, specific embodiments in which methods, apparatuses, and systems discussed herein can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

As used herein, a "-" (dash) used when referring to a reference number means "or", in the non-exclusive sense discussed in the previous paragraph, of all elements within the range indicated by the dash. For example, 103A-B means a nonexclusive "or" of the elements in the range {103A, 103B}, such that 103A-103B includes "103A but not 103B", "103B but not 103A", and "103A and 103B".

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus comprising:
    a first rigid circuit comprising a first plurality of bond pads proximate to a first edge of the first rigid circuit and a second plurality of bond pads proximate a second edge of the first rigid circuit, wherein the first edge and the second edge of the first rigid circuit share a common vertex;
    a second rigid circuit comprising a third plurality of bond pads proximate to a first edge of the second rigid circuit, the second rigid circuit adjacent the first rigid circuit and the first edge of the second rigid circuit facing the first edge of the first rigid circuit;
    a third rigid circuit comprising a fourth plurality of bond pads proximate a first edge of the third rigid circuit, the first edge of the third rigid circuit facing the second edge of the first rigid circuit;
    a first plurality of wire bonded wires, each wire bonded wire of the first plurality of wire bonded wires electrically and mechanically connected to a bond pad of the first plurality of bond pads and a bond pad of the third plurality of bond pads such that the first rigid circuit is free to rotate with respect to the second rigid circuit about a rotational axis generally parallel to the first edge of the first rigid circuit;
    a second plurality of wire bonded wires, each wire bonded wire of the second plurality of wire bonded wires electrically and mechanically connected to a bond pad of the second plurality of bond pads and a bond pad of the fourth plurality of bond pads; and
    a flexible carrier, wherein the first rigid circuit, second rigid circuit, and third rigid circuit are situated on the flexible carrier.

2. The apparatus of claim 1, further comprising insulating material covering substantially all of the first plurality of wire bonded wires.

3. The apparatus of claim 2, further comprising insulating material covering wire bond joints on the first plurality of bond pads.

4. The apparatus of claim 3, further comprising a molding material surrounding the first plurality of wire bonded wires in a region between the first rigid circuit and the second rigid circuit.

* * * * *